United States Patent
Tran et al.

(10) Patent No.: US 6,945,447 B2
(45) Date of Patent: Sep. 20, 2005

(54) THERMAL SOLDER WRITING EUTECTIC BONDING PROCESS AND APPARATUS

(75) Inventors: Dean Tran, Westminster, CA (US); Salim Akbany, Diamond Bar, CA (US); Maurice Lowery, Los Angeles, CA (US); Leon M. Singleton, Jr., Fullerton, CA (US); Ronald A. DePace, Mission Viejo, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 107 days.

(21) Appl. No.: 10/162,973

(22) Filed: Jun. 5, 2002

(65) Prior Publication Data

US 2003/0226877 A1 Dec. 11, 2003

(51) Int. Cl.⁷ ........................... B23K 31/00; B23K 31/02
(52) U.S. Cl. ..................... 228/180.21; 228/180.22; 228/180.5
(58) Field of Search ................ 228/179.1, 180.1, 228/180.21, 180.22, 180.5, 254, 219, 33, 37, 260, 42, 256, 4.5

(56) References Cited

U.S. PATENT DOCUMENTS

| | | | | |
|---|---|---|---|---|
| 4,351,468 A | * | 9/1982 | Floury et al. | 228/4.5 |
| 4,606,492 A | * | 8/1986 | Guslits | 228/179.1 |
| 4,732,313 A | * | 3/1988 | Kobayashi et al. | 228/180.5 |
| 4,948,946 A | * | 8/1990 | Fukunaga | 219/230 |
| 4,979,664 A | * | 12/1990 | Lyons et al. | 228/180.21 |
| 5,139,193 A | * | 8/1992 | Todd | 228/180.21 |
| 5,205,461 A | * | 4/1993 | Bickford et al. | 228/220 |
| 5,244,143 A | * | 9/1993 | Ference et al. | 228/180.21 |
| 5,320,273 A | * | 6/1994 | Goenka et al. | 228/33 |
| 5,340,016 A | * | 8/1994 | Fletcher et al. | 228/219 |
| 5,364,011 A | * | 11/1994 | Baker et al. | 228/180.21 |
| 5,377,961 A | * | 1/1995 | Smith et al. | 266/237 |
| 5,395,040 A | * | 3/1995 | Holzmann | 228/254 |
| 5,538,176 A | * | 7/1996 | Hasegawa et al. | 228/180.5 |
| 5,757,074 A | * | 5/1998 | Matloubian et al. | 257/702 |
| 5,772,106 A | * | 6/1998 | Ayers et al. | 228/254 |
| 6,186,192 B1 | * | 2/2001 | Orme-Marmarelis et al. | 141/18 |
| 6,455,785 B1 | * | 9/2002 | Sakurai et al. | 174/260 |
| 6,550,669 B1 | * | 4/2003 | Walz et al. | 228/264 |
| 6,634,092 B1 | * | 10/2003 | Iwasaki | 228/264 |
| 6,660,944 B1 | * | 12/2003 | Murata et al. | 174/261 |
| 6,744,126 B1 | * | 6/2004 | Chiang | 257/686 |
| 2003/0113075 A1 | * | 6/2003 | Marquez et al. | 385/92 |
| 2003/0168498 A1 | * | 9/2003 | Suter et al. | 228/256 |
| 2003/0183927 A1 | * | 10/2003 | Kojima et al. | 257/728 |

FOREIGN PATENT DOCUMENTS

| | | | | |
|---|---|---|---|---|
| JP | 55-33080 A | * | 3/1980 | |
| JP | 60-169159 A | * | 9/1985 | |

* cited by examiner

Primary Examiner—Lynne R. Edmondson
(74) Attorney, Agent, or Firm—Noel F. Heal

(57) ABSTRACT

A chip or die attachment process and related apparatus, in which a desired quantity of solder (7 or 17) is dispensed onto each, in turn, of a number of desired locations on a substrate (4 or 18), and then an integrated-circuit chip (10) is precisely positioned at each location immediately after the solder is dispensed at that location. Hot gas heaters are used both to heat the solder (7 or 17) as it is dispensed onto the substrate (4 or 18), and to heat the integrated-circuit chip (10) and to reflow the solder beneath the chip. In one form of the invention, the solder is dispensed from a wire spool (1) and melted in position on the substrate (4). Alternatively, the solder is dispensed as a drop (16) from a liquid solder reservoir (13).

5 Claims, 1 Drawing Sheet

THERMAL SOLDER WRITING EUTECTIC BONDING PROCESS AND APPARATUS

BACKGROUND OF THE INVENTION

This invention relates generally to fabrication and packaging of integrated circuit components and, more particularly, to a microwave or millimeter-wave integrated circuit (MMIC) chip attachment process. In complex devices operating at microwave and millimeter-wave frequencies, multiple MMIC chips are typically attached to a single chip carrier or substrate, and interconnected by ribbon or wire bonds. Conventional epoxy techniques for attaching a MMIC chip or die to a substrate prevent chips from being positioned closer than 2 mils (0.002 inch, or approximately 50 µm). Epoxy overflow from beneath the chips may cause input or output pads to be electrically coupled to ground. Therefore, chips must be spaced appropriately to allow for this overflow. The need to use relatively long ribbon lengths between more widely spaced chips results in circuit losses that detract from performance and cause circuit impedance mismatching problems. Ideally, for operation at higher frequencies it would be desirable to position MMIC chips side by side and as close as 0.5 mil apart (0.0005 inch or approximately 13 µm). Similar considerations apply to fabrication techniques used for assembly of other circuit components, such as ball grid array (BGA) devices, which also require precise positioning and attachment of components on a substrate.

Another drawback of the conventional epoxy die attachment technique is that the epoxy may take as long as one to several hours to cure. Ideally, a die attachment process that takes only a few seconds to complete would be preferred because this would drastically reduce cycle time during manufacturing and have a major impact on manufacturing cost.

Yet another drawback of the conventional epoxy die attachment technique is that extraneous organic matter bleeds out onto the substrate and remains in the housing used to contain the substrate and circuit chips. An ideal technique would have a low bleed-out of organic matter and would leave the substrate and housing clean after attachment of the circuit chips.

A further problem with epoxy die attachment is that bonding pads of the chips may crack during the wire bonding process. In the wire bonding process, the chips and substrates are heated to a temperature of approximately 120°–150° C., which softens the epoxy layer between each chip and the substrate. A characteristic of the wire bonding process is that a bonding tool strikes the bonding pad surface with a significant dynamic force to effect a bond. Because the underlying epoxy layer is soft at the required wire bonding temperature, the semiconductor material surrounding and beneath the bonding pad may crack. The process is analogous one in which dynamic force is applied to a thin and brittle material lying on top of a rubber sheet. The rubber sheet provides insufficient mechanical support for the overlying brittle material, which would tend to crack upon application of a dynamic force. Similarly, a semiconductor material supported by an underlying softened epoxy layer tends to crack upon application of a dynamic force. Cracking causes unwanted electrical discontinuities, which significantly affect chip performance, or may render the chip inoperative. An ideal die attachment process would be unaffected by the dynamic forces inherent in wire bonding.

In addition to the foregoing requirements, a die attachment material should provide good electrical and thermal conductivity. Because of the difficulties associated with epoxy for die attachment, soldering processes have been proposed. One such process uses a solder "preform" layer, consisting of quantities of solder applied at precise locations. The preform layer is positioned on the substrate. Then the dies are positioned over the preform layer and the solder is reflowed by the application of heat. One inherent difficulty of this process is that it requires two alignment steps: first aligning the preform layer with the substrate and then aligning the individual dies or chips on the substrate. Therefore, the goal of aligning the dies in close proximity is rendered much more difficult. In addition, the preformed solder is subject to oxidation and, upon reflowing, the oxidation can result in the formation of voids, which are discontinuities in the thermal and electrical transmission paths. Another similar process is referred to as "solder bumping," in which quantities of tin or tin and lead solder are pre-positioned on the substrate and allowed to cool. When the dies or chips are positioned over the solder bumps, the solder is reflowed by the application of heat. Again there is an inherent problem with oxidation of the solder, resultant void formation and the effects this may have on electrical and thermal resistivity.

It will be appreciated from the foregoing that there is still a need for a die attachment process that provides good electrical and thermal contact, but avoids the known difficulties of attachment by epoxy or using preformed layers or quantities of solder. The present invention meets these requirements.

BRIEF SUMMARY OF THE INVENTION

The present invention resides in a process and apparatus for attaching circuit components to a substrate. Briefly, and in general terms, the process of the invention comprises the steps of dispensing a precise quantity of solder onto a substrate at one of a plurality of desired locations at which components are to be attached; precisely placing a component over the quantity of solder at the location; heating the component, and with it the underlying quantity of solder, with hot gas; reflowing the quantity of solder beneath the component, as a result of the heating step, to form a continuous layer of solder between the component and the substrate; allowing the solder to cool, to complete a reliable electrical and thermal bond between the component and the substrate; and repeating the foregoing steps at each of the desired locations at which components are to be attached. Following the process of the invention permits the components to be positioned in close proximity to each other without the difficulties that ensue from using prior art techniques.

Preferably, the step of heating the component is performed by directing a flow of heating gas, such as inert gas or forming gas, onto the component from at least one hot gas injection system.

In accordance with one embodiment of the invention, the step of dispensing a precise quantity of solder includes dispensing the solder initially in solid wire form from a wire spool; feeding the wire solder toward the desired location on the substrate; holding an end portion of the solder wire in the desired location; and simultaneously heating the end portion of the wire with hot gas, to melt the end portion and write the desired quantity of solder into the desired location. Preferably, the step of heating the end portion of the wire is performed by directing a flow of heating gas onto the wire from at least one hot gas injection system.

In an alternate embodiment of the process, the step of dispensing a precise quantity of solder includes positioning a liquid solder reservoir over the desired location of the substrate; applying a controlled pressure to the liquid solder in the reservoir, to eject a drop of the solder from a nozzle attached to the reservoir; and simultaneously heating the drop of solder as it leaves the nozzle, to keep the solder in liquid form as it is deposited on the substrate. Preferably, the step of simultaneously heating the drop of solder is performed by directing a flow of heating gas onto the end portion of the drop of solder from at least one hot gas injection system.

More specifically, the components to be attached to the substrate are integrated-circuit chips, or, even more specifically, the components are microwave or millimeter wave integrated circuit (MMIC) chips.

The invention may also be defined in terms of apparatus for attaching integrated-circuit chips to a substrate by soldering. One embodiment of the apparatus comprises a wire dispensing mechanism, including a spool for holding wire solder and a wire feed device, for dispensing a precise quantity of solder from the spool; a tool for holding a dispensed portion of the solder wire in place at each of a plurality of desired locations at which integrated-circuit chips are to be attached to a substrate; a first hot gas injection heater system positioned near the tool for holding the wire solder in place, to heat and melt the dispensed solder wire at each of the desired locations in turn, thereby depositing a desired quantity of solder onto each desired location; a pick-and-place tool, for precisely placing an integrated-circuit chip over the quantity of solder at each successive desired location as soon as the solder has been dispensed at that location; and a second hot gas injection heater system positioned near the pick-and-place tool, employed to heat the integrated-circuit chip and the underlying quantity of solder and thereby to reflow the solder and form a continuous layer of solder between the chip and the substrate. In an alternate form of the apparatus, solder is not dispensed in the form of solder wire, but from apparatus comprising a liquid solder reservoir, including a reservoir heater, an inlet for pressurized gas for applying a controlled pressure to the solder in the reservoir, and an outlet nozzle through which drops of liquid solder are dispensed, to provide a precise quantity of solder at each of a plurality of desired locations at which integrated-circuit chips are to be attached to a substrate. The apparatus in this embodiment also includes a first hot gas injection heater system positioned near the reservoir nozzle, to heat the dispensed solder drop at each of the desired locations in turn, a pick-and-place tool, and a second hot gas injection heater system. As in the first mentioned embodiment of the apparatus, the pick-and-place tool is for precisely placing an integrated-circuit chip over the quantity of solder at each successive desired location as soon as the solder has been dispensed at that location; and the second hot gas injection heater system is positioned near the pick-and-place tool, to heat the integrated-circuit chip and the underlying quantity of solder, and thereby to reflow the solder and form a continuous layer of solder between the chip and the substrate.

It will be appreciated from the foregoing summary that the present invention represents a significant improvement in die attachment techniques. In particular, the invention permits integrated-circuit chips, such as MMIC chips, to be positioned in close proximity to each other without the difficulties that ensue from using epoxy or other approaches for attachment. Other aspects and advantages of the invention will become apparent from the following more detailed description, taken in conjunction with the accompanying drawings.

DETAILED DESCRIPTION OF THE INVENTION

Figure 1:
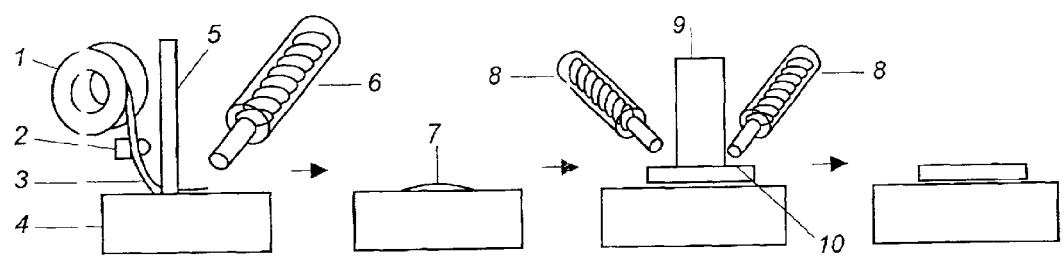
FIG. 1 is diagram depicting the steps of a die attachment process in accordance with one embodiment of the invention.

As shown in the drawings for purposes of illustration, the present invention pertains to a die attachment process, that is, a process for attaching a circuit chip or die to a substrate or housing. The process of the invention is particularly applicable to attachment of microwave or millimeter-wave integrated circuit (MMIC) chips to a substrate or housing because, for devices operating at very high frequencies, it is desirable to locate MMIC chips in very close proximity to each other. Conventional die attachment techniques using epoxy have significant drawbacks, which have been discussed above. Soldering approaches using preformed layers or small quantities of solder have both alignment problems and difficulties arising from solder oxidation.

In accordance with the present invention, die attachment is performed by applying liquid solder to an attachment site, then immediately positioning the die over the site and reflowing the solder, which is next allowed to cool and complete the attachment. The process of the invention avoids all the known difficulties of epoxy die attachment, as well as the drawbacks associated with solder "preform" layers and preformed solder "bumps."

FIG. 1 shows the successive steps performed in accordance with one embodiment of the process. Alloyed solder in the form of wire on a spool, indicated by reference numeral 1, is fed through a solder wire feeder 2 and directed as indicated at 3 onto a desired location on a substrate 4 or package housing. A solder wire tool 5 controls the precise position and amount of the solder applied, and a quartz hot gas injection system 6 provides a flow of hot gas to melt the solder in position so that it may be "written" onto the substrate 4 or housing in the desired area or areas. The hot gas may be an inert gas or a forming gas that includes 10–20% of hydrogen to remove oxygen from the solder site, and thereby minimize the effects of oxidation. This first step of dispensing the solder leaves a quantity of solder 7 in the desired site on the substrate 4. Next, as heat is applied through one or more additional quartz hot gas injection systems 8, a die pick-and-place tool 9 positions a MMIC chip or other die 10 in precisely the desired location on the substrate 4. The heat applied to reflow the solder is controlled to provide a temperature approximately 20% higher than the liquidous temperature of the solder mixture. This allows the solder to flow beneath the chip 10 to provide, a good die connection with the substrate 4.

Various solder alloys can be used in the process. For example, an alloy of gold and tin (80Au20Sn), which has solid and liquidous temperatures ($T_s$ and $T_l$) of 280° C. or a tin-gold alloy (96.5Sn3.5Au), which has $T_s=T_l=221°$ C., or a tin-antimony alloy (63Sn37Sb), which has $T_s=T_l=183°$ C., or other equivalent alloys. Selection of the solder alloy is made based upon the contact metals of the chips and substrates to be joined.

Figure 2:
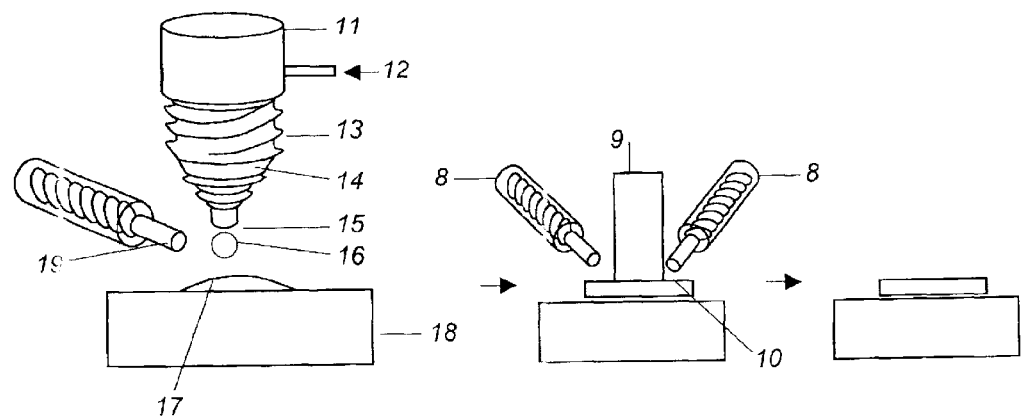
FIG. 2 is a diagram depicting an alternative technique for dispensing solder in accordance with the invention.

FIG. 2 shows an alternative approach for dispensing and writing the solder. Instead of a solid solder wire, this approach uses a heated reservoir of liquidous solder. The construction includes a thermal isolation cap 11, an inlet 12 for quartz hot pressurized inert gas or forming gas, a heater 13, and a container 14 of alumina or tungsten to hold the liquidous solder. The lower end of the container 14 terminates in a nozzle 15, through which the solder is dispensed in the form of a drop 16, the size of which is determined by the size of the nozzle and by the pressure applied through the inlet 12 above the solder in the container 14. The drop 15 forms a solder bump 17 on a substrate 18. Heated forming gas is applied through a nozzle 19 to prevent oxidation of the solder as it is written onto the substrate 18. After writing the solder onto the substrate 18, the process follows the same steps as the first embodiment, for placing the die 10 in the desired site on the substrate.

The process of the invention permits chips to be placed within 0.5 mil (0.0005 inch or approximately 13 $\mu$m) of each other because the solder will flow only onto metal surfaces, unlike epoxy, which attaches to any material and tends to overflow the "footprint" of each chip on the substrate. Also, because solder has a higher melting point than epoxy, e.g., 280° C., there is no concern that the wire bonding process, which takes place at 120° C. to 150° C., will soften the solder. Therefore, cracking around or beneath bonding pads is avoided.

It will be appreciated from the foregoing that the present invention represents a significant advance in the field of integrated circuit fabrication and assembly. In particular, the invention provides a reliable mechanical bond and good electrical and thermal contact between a substrate and components such as chips or dies and allows the chips or dies to be positioned in closer proximity to each other. Problems relating to cracking of components during wire bonding are eliminated because the solder layer is not softened by the temperatures used for bonding. It will also be appreciated that, although the invention has been described in detail for purposes of illustration, various modifications may be made without departing from the spirit and scope of the invention. Accordingly, the invention should not be limited except as by the appended claims.

What is claimed is:

1. A die attachment process for attaching integrated-circuit chips by soldering to a substrate, the process comprising the steps of:

dispensing a precise quantity of solder onto a substrate at one of a plurality of desired locations at which chips are to be attached;

immediately after the solder dispensing step, precisely placing a chip over the quantity of solder at the location;

heating the chip, and with it the underlying quantity of solder, with hot gas;

reflowing the quantity of solder beneath the chip, as a result of the heating step, to form a continuous layer of solder between the chip and the substrate;

allowing the solder to cool, to complete a reliable electrical and thermal bond between the chip and the substrate; and repeating all of the foregoing steps in sequence at each of the desired locations at which components are to be attached, whereby chips maybe positioned in close proximity;

wherein the step of dispensing a precise quantity of solder includes:

dispensing the solder initially in solid wire form from a wire spool;

feeding the wire solder toward the desired location on the substrate;

holding an end portion of the solder wire in the desired location; and simultaneously heating the end portion of the wire with hot gas, to melt the end portion and write the quantity of solder into the desired location.

2. A process as defined in claim 1, wherein the step of heating the end portion of the wire is performed by directing a flow of heating gas onto the end portion of the wire from at least one hot gas injection system.

3. A process for attaching integrated-circuit chips to a substrate by soldering, the process comprising the steps of:

dispensing a precise quantity of solder in solid wire form from a wire spool;

feeding the wire solder toward one of a plurality of desired locations at which integrated-circuit chips are to be attached to a substrate;

holding an end portion of the solder wire in the desired location;

simultaneously heating the end portion of the wire with hot gas from a hot gas injection system, to melt the end portion and write the desired quantity of solder onto the desired location;

immediately after the desired quantity of solder is written onto the desired location, precisely placing an integrated-circuit chip over the quantity of solder at the desired location;

heating the integrated-circuit chip, and with it the underlying quantity of solder, with hot gas from at least one hot gas injection systems;

reflowing the quantity of solder beneath the integrated-circuit chip, as a result of the step of heating the chip, to form a continuous layer of solder between the chip and the substrate;

allowing the solder to cool, to complete a reliable electrical and thermal bond between the chip and the substrate; and repeating all of the foregoing steps in sequence at each of the desired locations at which other integrated-circuit chips are to be attached, whereby chips may be positioned in close proximity to each other for improved performance at high frequencies.

4. A process as defined in claim 3, wherein the solder is an alloy of metals including gold.

5. A process for attaching microwave or millimeter-wave integrated circuit (MMIC) chips to a substrate, the process comprising the steps of:

dispensing a precise quantity of solder in solid wire form from a wire spool, wherein the solder is an alloy of metals including gold;

feeding the wire solder toward one of a plurality of desired locations at which MMIC chips are to be attached to a substrate;

holding an end portion of the solder wire in the desired location;

simultaneously heating the end portion of the wire with hot gas from a hot gas injection system, to melt the end portion and write the desired quantity of solder onto the desired location;

immediately after the quantity of solder is written onto the desired location, precisely placing a MMIC chip over the quantity of solder at the desired location;

heating the MMIC chip, and with it the underlying quantity of solder, with hot gas from at least one hot gas injection systems;

reflowing the quantity of solder beneath the MMIC chip, as a result of the step of heating the chip, to form a continuous layer of solder between the chip and the substrate;

allowing the solder to cool, to complete a reliable electrical and thermal bond between the MMIC chip and the substrate; and repeating all of the foregoing steps in sequence at each of the desired locations at which other MMIC chips are to be attached, whereby MMIC chips may be positioned in close proximity to each other for improved performance at high frequencies.

* * * * *